(12) United States Patent
Rehmeyer et al.

(10) Patent No.: US 9,183,952 B2
(45) Date of Patent: Nov. 10, 2015

(54) APPARATUSES AND METHODS FOR COMPRESSING DATA RECEIVED OVER MULTIPLE MEMORY ACCESSES

(71) Applicant: MICRON TECHNOLOGY, INC., Boise, ID (US)

(72) Inventors: James S. Rehmeyer, Boise, ID (US); John F. Schreck, Lucas, TX (US); Timothy B. Cowles, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 156 days.

(21) Appl. No.: 13/771,838

(22) Filed: Feb. 20, 2013

(65) Prior Publication Data

US 2014/0237305 A1    Aug. 21, 2014

(51) Int. Cl.
| | |
|---|---|
| *G11C 29/40* | (2006.01) |
| *G11C 29/44* | (2006.01) |
| *G11C 29/48* | (2006.01) |
| *G11C 29/00* | (2006.01) |
| *G06F 11/07* | (2006.01) |
| *G01R 31/317* | (2006.01) |
| *G01R 31/3187* | (2006.01) |
| *G01R 31/319* | (2006.01) |

(Continued)

(52) U.S. Cl.
CPC ............ *G11C 29/40* (2013.01); *G01R 31/3187* (2013.01); *G01R 31/3193* (2013.01); *G01R 31/31703* (2013.01); *G01R 31/31932* (2013.01); *G01R 31/31935* (2013.01); *G06F 11/076* (2013.01); *G11C 29/44* (2013.01); *G11C 29/48* (2013.01); *G11C 29/70* (2013.01); *G11C 2029/4002* (2013.01); *G11C 2029/5606* (2013.01)

(58) Field of Classification Search
CPC ............ G11C 29/40; G11C 2029/4002; G11C 29/44; G11C 29/48; G11C 29/70; G11C 2029/5606; G06F 11/076; G01R 31/31703; G01R 31/3187; G01R 31/3193; G01R 31/31932; G01R 31/31935
USPC ......... 714/718, 719, 710, 711, 733, 735, 736, 714/742, 763, 704, 706; 365/189.07, 365/189.05, 200, 201
See application file for complete search history.

(56) References Cited

U.S. PATENT DOCUMENTS

| | | | | |
|---|---|---|---|---|
| 5,535,164 | A | * | 7/1996 | Adams et al. .................. 365/201 |
| 5,805,789 | A | * | 9/1998 | Huott et al. .................. 714/6.32 |

(Continued)

OTHER PUBLICATIONS

Chen et al., Enabling Embedded Memory Diagnosis via Test Response Compression, 2001, IEEE, pp. 292-298.*

*Primary Examiner* — John J Tabone, Jr.
(74) *Attorney, Agent, or Firm* — Dorsey & Whitney LLP

(57) ABSTRACT

Apparatuses and methods for compressing data responsive to a plurality of memory accesses is described. An example compression circuit includes a comparator configured to compare data provided by a group of memory cells associated with a repair address. Each subset of one or more bits of the data is sequentially provided by the group of memory cells responsive to a respective memory access of a plurality of memory accesses. The example compression circuit further including an error bit latch coupled to the comparison circuit. The error bit latch configured to, responsive to an output received from the comparison circuit indicating an error, compress the data to an error bit by setting the error bit to an error detected state and latching the error bit having the error detected state.

27 Claims, 4 Drawing Sheets

(51) Int. Cl.
*G01R 31/3193* (2006.01)
*G11C 29/56* (2006.01)

(56) References Cited

U.S. PATENT DOCUMENTS

| | | | |
|---|---|---|---|
| 5,859,804 A * | 1/1999 | Hedberg et al. | 365/201 |
| 5,913,928 A * | 6/1999 | Morzano | 714/710 |
| 5,935,263 A * | 8/1999 | Keeth et al. | 714/718 |
| 6,026,505 A * | 2/2000 | Hedberg et al. | 714/711 |
| 6,065,134 A * | 5/2000 | Bair et al. | 714/6.11 |
| 6,069,829 A * | 5/2000 | Komai et al. | 365/201 |
| 6,072,737 A * | 6/2000 | Morgan et al. | 365/201 |
| 6,081,910 A * | 6/2000 | Mifsud et al. | 714/718 |
| 6,138,254 A * | 10/2000 | Voshell | 714/710 |
| 6,269,455 B1 * | 7/2001 | Deas | 714/29 |
| 6,484,278 B1 * | 11/2002 | Merritt et al. | 714/719 |
| 6,788,595 B2 * | 9/2004 | Nguyen et al. | 365/200 |
| 6,839,277 B2 * | 1/2005 | Nguyen et al. | 365/185.04 |
| 6,920,525 B2 * | 7/2005 | Chadwick et al. | 711/108 |
| 6,950,971 B2 * | 9/2005 | Boehler et al. | 714/710 |
| 7,103,815 B2 * | 9/2006 | Ong et al. | 714/736 |
| 7,194,667 B2 * | 3/2007 | McBride | 714/718 |
| 7,263,638 B2 * | 8/2007 | Hokenmaier | 714/719 |
| 7,487,420 B2 * | 2/2009 | Keller | 714/732 |
| 7,657,802 B2 * | 2/2010 | Naso | 714/718 |
| 7,843,741 B2 | 11/2010 | Jeong et al. | |
| 2002/0157051 A1 * | 10/2002 | Eckelman et al. | 714/736 |
| 2003/0088815 A1 * | 5/2003 | Boehler et al. | 714/710 |
| 2004/0181724 A1 * | 9/2004 | McBride | 714/735 |
| 2004/0246337 A1 * | 12/2004 | Hasegawa et al. | 348/189 |
| 2005/0047229 A1 * | 3/2005 | Nadeau-Dostie et al. | 365/201 |
| 2005/0066226 A1 * | 3/2005 | Adams et al. | 714/7 |
| 2006/0136792 A1 * | 6/2006 | Hokenmaier | 714/718 |
| 2006/0156136 A1 * | 7/2006 | McBride | 714/736 |
| 2007/0226553 A1 * | 9/2007 | Fekih-Romdhane et al. | 714/718 |
| 2009/0158087 A1 * | 6/2009 | Maeno et al. | 714/6 |
| 2009/0225610 A1 * | 9/2009 | Hokenmaier et al. | 365/201 |
| 2012/0155203 A1 | 6/2012 | Hwang et al. | |
| 2012/0275247 A1 * | 11/2012 | Hwang et al. | 365/200 |

* cited by examiner

US 9,183,952 B2

APPARATUSES AND METHODS FOR COMPRESSING DATA RECEIVED OVER MULTIPLE MEMORY ACCESSES

TECHNICAL FIELD

Embodiments of the invention relate generally to electronic memories, and more particularly, in one or more of the illustrated embodiments, to data compression that may be used during testing of electronic memories.

DESCRIPTION OF RELATED ART

Advances in technology have resulted in the need for high density memory architecture(s). Memory devices require testing of each individual bit before that memory device can be shipped. As density of memory architectures increase, the time required during testing of these memory devices also increases. Compressing data during testing may be done to improve test efficiency. In current architectures, an access of a memory may retrieve individual bits of data from several individual memory locations that are associated with the address location identified in the access. Those individual bits are pipelined to output drivers to provide the individual bits of data to an external source. A number of input/output (I/O) channels used to provide the individual bits of data to the external source varies based on a type of memory device and architecture of the memory device.

Existing compression schemes may retrieve the individual bits of data from a single memory access and compress the individual bits together in a manner that reduces a time (e.g., a number of clock cycles) required to test an entire memory array of the memory device and with fewer output pins as compared with a native mode of the memory device. To allow a memory device to repair defective bits identified during testing, individual bits of data that are compressed from the single memory access typically correspond to a common repair address.

Future architectures may include memory accesses where each individual bit of data retrieved responsive to a memory access may correspond to a different repair address. Traditional compression methods compressing individual bits of a single memory access are ineffective in architectures where the individual bits of data correspond to different repair addresses, as compression would result in an inability to identify a repair address associated with a defective bit. Testing without using compression may be inefficient and may result in a substantial increase in test time.

DETAILED DESCRIPTION

Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments.

Figure 1:
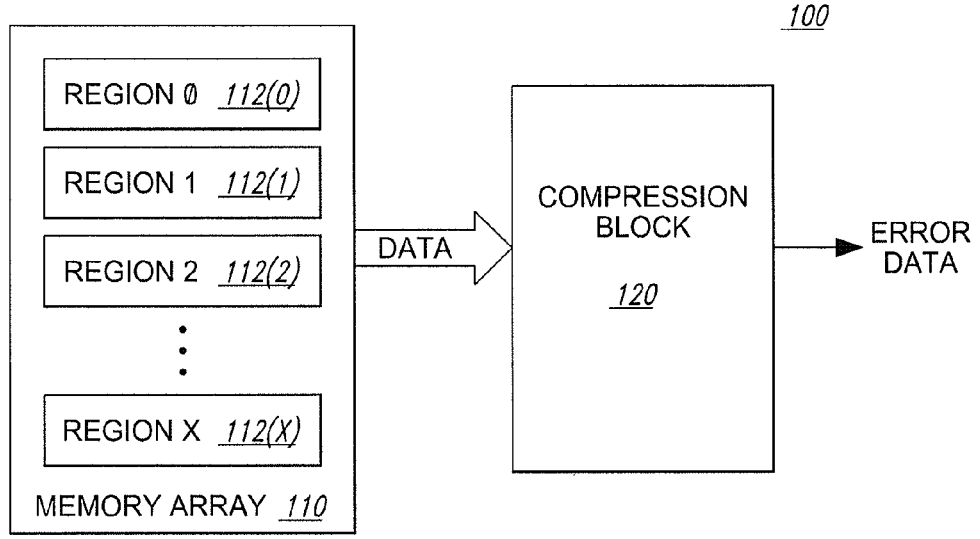
FIG. 1 is a block diagram of a particular illustrative embodiment of an apparatus including a data compression block.

Referring to FIG. 1, a particular illustrative embodiment of an apparatus (e.g., an integrated circuit, a memory device, a memory system, an electronic device or system, a smart phone, a tablet, a computer, a server, etc.) including a data compression block is disclosed and generally designated 100. The apparatus 100 may facilitate data compression during memory testing in architectures where data is read from groups of memory cells of an array, and each group of memory cells is associated with a respective (e.g., different) repair address. Each group of memory cells may provide respective binary digit or digits (e.g., "bit" or "bits") of the data read responsive to a memory access command. That data read may be test data previously written for testing of the memory. The data is compressed by compressing corresponding bits of the data read responsive to a plurality of independent memory access commands. For example, a bit at the least significant bit (LSB) position of first data read responsive to a first memory access command is compressed with a bit also in the same LSB position of second data read responsive to a second memory access command. Likewise, a bit at the most significant bit (MSB) position of the first data is compressed with a bit also in the same MSB position of the second data. In another embodiment, portions of data retrieved from a group of memory cells corresponding to a particular repair address received over a plurality of memory accesses may be included at different positions of two or more of the plurality of memory accesses.

The apparatus 100 may include a memory array 110 that includes X+1 memory array regions, such as memory array regions 0-X 112(0)-(X). Each of the memory array regions 0-X 112(0)-(X) may include respective plurality of groups of memory cells from which data is read responsive to a memory access command. The memory array 110 may be coupled to a compression block 120. The compression block 120 may compress data received responsive to a plurality of memory accesses to produce error data.

As explained above, the memory array 110 may include X+1 memory array regions 0-X 112(0)-(X). Each memory array region may include memory cells arranged in an array having a plurality of rows and a plurality of columns. The plurality of columns may be divided into column groups, and in some embodiments, each column group is associated with a respective I/O channel of a plurality of I/O channels. For example, a first column group may be associated with a first I/O channel, a second column group may be associated with a second I/O channel, etc. A respective bit of the data may be read from a column group responsive to a memory access command. In another embodiment, the plurality of rows may be divided into row groups, and, each row group may be associated with a respective I/O channel of a plurality of I/O channels. For example, a respective bit of the data may be read from a row group responsive to a memory access command.

Each of the memory array regions 0-X 112(0)-(X) may be associated with respective sets of redundancy memory elements that are used to repair defective memory cells by mapping defective cells to a redundancy memory element. A redundancy memory element may replace a plurality of adjacent memory cells, for example, a plurality of memory cells along a row or rows, a plurality of memory cells along a column or columns, or a plurality of memory cells within an array of rows and columns. That is, in using a redundancy memory element to repair a defective memory cell or defective memory cells, the redundancy memory element will in effect replace not only the defective memory cell or defective memory cells, but all of the memory cells of the plurality of adjacent memory cells covered by the redundancy memory element. The number of memory cells of the plurality of adjacent memory cells replaced by a redundancy memory element, and the arrangement of the memory cells of the plurality of adjacent memory cells may be based on an architecture of the memory array 110.

In some embodiments, each column group may be associated with a respective set of redundancy memory elements that may be used for repairing defective memory cells within the column group. Thus, a defective memory cell or defective memory cells of a column group may be replaced with a redundancy memory element of the respective set of redundancy memory elements associated with that column group. In another embodiment, each row group may be associated with a respective set of redundancy memory elements that may be used for repairing defective memory cells within the respective row group.

The compression block 120 may include a plurality of data compression circuits. An embodiment of a data compression circuit that may be used will be described below in greater detail with reference to FIG. 2. The compression block 120 may receive data read responsive to a plurality of memory accesses from the column groups of a memory array region of the memory array 110. Each of the column groups may provide a respective bit of the data read for each memory access. The compression block 120 may then compress the data read from the respective column groups using comparison logic to provide error data that indicates whether the respective column groups have a defective memory cell or memory cells. The error data provided by the data compression circuits may be stored in a buffer in the compression block 120 to be later provided.

During operation, data are each retrieved from a particular region (e.g., one of the memory array regions 0-X 112(0)-(X) of the memory array 110) responsive to a memory access. The data written to a particular region of the memory array 110 may be test data. Each bit of the data may be read from a respective column group, and each of the column groups may be associated with a respective repair address that is distinct from repair addresses associated with the other column groups that provided bits of the memory access data. For example, a first bit of the data may be read from a first column group associated with a first repair address, a second bit of the data may be read from a second column group associated with a second repair address, etc. Further, each bit position of each of the plurality of data may be associated with a respective column group.

Each bit of the data may be provided to the compression block 120 from a column group via an associated I/O channel. For example, a first bit of the data is provided to a first data compression circuit of the compression block 120 via a first I/O channel, a second bit of the data is provided to a second data compression circuit of the compression block 120 via a second I/O channel, etc. Thus, with each memory access, each I/O channel will provide a respective bit of data from a respective column group associated with a respective repair address. In some embodiments, each I/O channel may provide more than one bit to the compression block 120. For example, a first subset of bits of the data is provided to the compression block 120 via a first I/O channel, a second subset of bits of the data is provided to the compression block 120 via a second I/O channel, etc. In other embodiments, if, for example, a first bit of the data and a second bit of the data correspond to a common repair address, the first bit of the data is provided to the first data compression circuit of the compression block 120 via the first I/O channel and the second bit of the data is provided to the first data compression circuit of the compression block 120 via the second I/O channel.

As previously discussed, the compression block 120 may include a plurality of data compression circuits (not shown in FIG. 1). In some embodiments, the compression block 120 includes a respective data compression circuit for each of the I/O channels. In another embodiment, the compression block 120 includes a respective data compression circuit for each of one or more subsets of bits of a memory access to be compressed. For example, if a memory access provides 128 bits of data, and 64 of bits of the data are from different repair addresses, and a remaining 64 bits are from a common repair address, the compression block may require at least 65 data compression circuits. Alternatively, if the data includes 4 bits of data from each of 32 unique repair addresses, the compression block may require at least 32 data compression circuits. An example of a data compression circuit of the compression block 120 is described in further detail with reference to FIG. 2. In some embodiments, a data compression circuit compares the data received via a respective I/O channel responsive to each of the plurality of memory accesses. In another embodiment, a data compression circuit may compare data corresponding to a particular repair address that is received via two or more respective I/O channels responsive to each of the plurality of memory accesses. Prior to comparison of the data provided on the respective I/O channel, an error bit is cleared to a no error detected state at the data compression circuit. Responsive to detection of an error in the data provided on a respective I/O channel based on the comparison (e.g., the data is mismatched), the error bit may be set to an error detected state at the data compression circuit, and the error bit having the error detected state is latched in the data compression circuit, for example, by an error bit latch. If no error is detected in the data provided on the respective I/O channel based on the comparison, the error bit remains in the no error detected state at the error bit latch. By comparing the data provided on a respective I/O channel and clearing and/or setting a state of the error bit based on the comparison, the data read from a column group may be compressed into the error bit having a state that indicates whether any of the memory cells read from the respective column group are defective. That is, a state of the error bit latched may remain unchanged responsive to a successful comparison (e.g., data is not mismatched) and changed to the error detected state responsive to an unsuccessful comparison. Thus, if the error bit has the no error detected state responsive to completion of the comparison of the data, then no errors were detected in the data. If the error bit has the error detected state responsive to completion of the comparison of the data, then at least one error was detected in at least one bit of the data. As a result, each data compression circuit may compress data from a respective column group that is associated with a common repair address. Error data, which may include each of the error bits, may be stored in a buffer (not shown) and then provided at an output of the compression block 120. Responsive to completion of compressing error data for one or more column groups, the error data may be serially output from an output buffer (not shown) of the apparatus via one or more outputs DQs (not shown). The error data may be output contemporaneously with compression of data from additional column groups of the memory array 110.

In a specific, non-limiting example, each region of the memory array 110 includes 128 column groups, each column group associated with a respective I/O channel. A memory access may retrieve 128 bits, one bit from each column group via a respective I/O channel. Additionally, each of the 128 bits are associated with a different repair address by virtue of being read from a respective column group. The compression block 120 may include 128 data compression circuits to process data read from 128 column groups and associated with 128 different repair addresses. Further in the non-limiting example, each data compression circuit compresses eight bits from a respective column group. Accordingly, eight memory accesses are used to read eight bits from the respective column group. Each of the eight bits may be read from a different memory cell of the column group. In some embodiments, each of the eight different memory cells is coupled to a respective column of memory. The eight bits of data are compressed by a data compression circuit to one corresponding error bit. Thus, over the course of the eight memory accesses, eight bits from each of 128 column group, or 1024 total bits, are compressed into 128 error bits, which are included in the error data output from the compression block 120. Thus, in this example, four DQ, 128 clock cycles would be required to output the data without compression and 16 would be required to output the data with compression.

The preceding example is not intended to limit embodiments of the invention to the particular details previously discussed. Those of skill in the art would appreciate that the invention should not be limited as such. Further, one of ordinary skill in the art would recognize that a set of redundancy memory elements may be associated with a respective group of memory cells other than a column group(s) or a row group(s). For example, a set of redundancy memory elements may be associated with a group of memory cells that corresponds to a subset of columns of the plurality of columns and a subset of rows of the plurality of rows.

Figure 2:
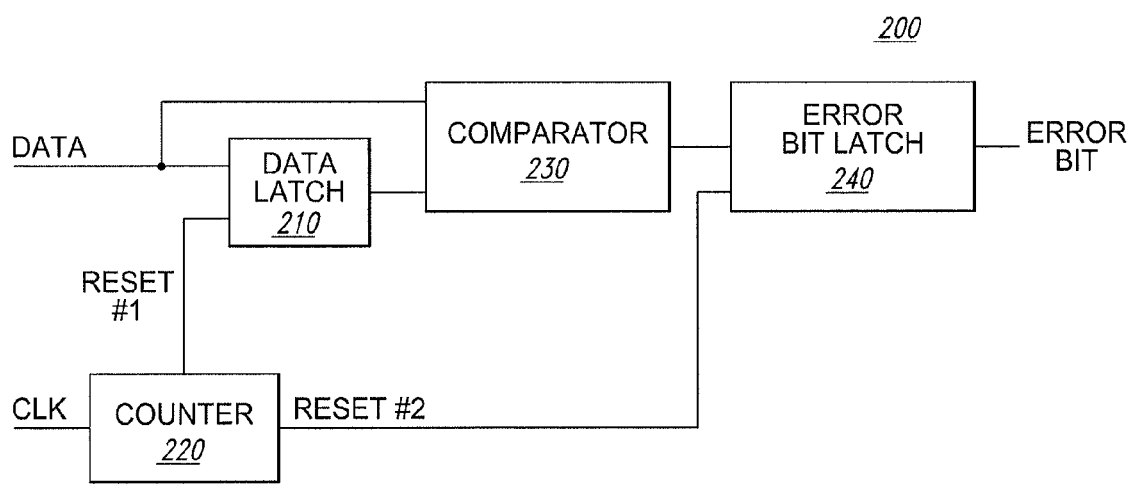
FIG. 2 is a block diagram of a particular illustrative embodiment of a data compression circuit.

FIG. 2 illustrates an exemplary data compression circuit 200 according to an embodiment of the invention. A plurality of the data compression circuit 200 may be included in the compression block 120 of FIG. 1. The data compression circuit 200 includes a comparator 230 (e.g., a comparison circuit) that receives and compares a first input from a data latch 210, which latches data received responsive to a previous memory access, and a second input, which includes data received responsive to a most recent memory access. A counter 220 provides an active first reset signal RESET #1 (e.g., the RESET #1 signal having a high logic value) and an active second reset signal RESET #2 (e.g., the RESET #2 signal having a high logic value) to reset the data latch 210 and an error bit latch 240, respectively. The error bit latch 240 latches and provides an error bit responsive to an output from the comparator 230.

In operation, prior to an initial comparison, the error bit stored at the error bit latch 240 is cleared to a no error detected state responsive to an active RESET #2 signal. The data latch 210 receives and latches first data responsive to a first memory access, and the counter 220 changes (e.g., changes or decrements) responsive to a clock signal. Second data is subsequently received responsive to a second memory access and the counter 220 changes based on the clock signal. The comparator 230 performs a comparison of the first data with the second data. The comparison, for example, may be a bitwise comparison using an XNOR gate. The comparator 230 provides a result of the comparison having a value that is indicative of whether an error is detected (e.g., a value of the first data is different from a value of the second data). Responsive to the result indicating that an error in the data is detected, the error bit latch 240 sets the error bit to an error detected state and latches the error bit in the error state. Otherwise, the error bit latch 240 maintains the no error detected state. That is, a state of the error bit latched at the error bit latch 240 may remain unchanged responsive to a successful comparison (e.g., a value of first data equals a value of second data). The counter 220 may provide an active RESET #1 signal to the data latch 210 to reset the data latch 210 when a value of the counter 220 indicates a second clock signal cycle has completed.

Subsequently, the data latch 210 may receive and latch third data responsive to a third memory access, and the counter 220 may change responsive to the clock signal. Further, fourth data may be received responsive to a fourth memory access, with the counter 220 changing responsive to the clock signal. The comparator 230 performs a second comparison of the third data with the fourth data, and the error bit latch 240 sets the error bit to the error detected state and latches the error bit having the error detected state based on result data provided by the comparator 230 responsive to the comparison of the third data and the fourth data. If no error is detected based on the comparison, the state of the error bit at the error bit latch remains unchanged from a previous comparison. The latching of data, comparison of the data, and changing the state of the error bit from two memory accesses may continue until a value of the counter 220 is equal to a count of data to be compressed into an error bit. If an error is detected based on any of the comparisons, the error bit having the error detected state remains latched at the error bit latch 240 until reset by the counter 220. The error bit is provided at an output to indicate whether one or more memory cells in a group of memory cells associated with a particular repair address failed the test. Responsive to the value of the counter being equal to the number of data to be compressed into an error bit, the counter 220 provides an active RESET #2 signal to the error bit latch 240 to clear (e.g., reset) the error bit to the no error detected state prior to receiving data from a subsequent memory access. In an embodiment, the counter 220 may be reset after providing the active RESET #2 signal to clear the error bit latch 240.

In the specific, non-limiting example described with reference to FIG. 1, the data compression circuit 200 may receive eight data bits, where each bit is received responsive to a respective (e.g., corresponding) memory access of eight total memory accesses. The comparator 230 may perform a comparison of pairs of the eight received data bits (e.g., for a total of four comparisons). The counter 220 may reset the data latch 210 after each comparison by providing an active RESET #1 signal. The error bit latch 240 may latch an error bit having the error detected state responsive to a result from the comparator 230 having a value indicating the detection of an error. The counter 220 may clear the error bit to the no error detected value at the error bit latch 240 after the fourth comparison has been performed. The error bit may be cleared responsive to the clock signal by providing an active RESET #2 signal. Further related to the specific non-limiting example described with reference to FIG. 1, the compression block 120 of FIG. 1 may include 128 of the data compression circuits 200, one for each of the 128 I/O channels.

The data compression circuit 200 may be modified to latch more than one bit prior to performing a comparison at the comparator 230, and that the comparator 230 may be modified to compare more than two bits. Further, more or less than 8 bits of data can be compressed into an error bit. In an embodiment, the number of data bits that are compressed may depend on the configuration (e.g., number of columns wide) of the redundancy memory elements for a group.

The data compression circuit 200 compresses each bit corresponding to a respective group into a single error bit, where each bit of the respective group is retrieved responsive to a respective memory access in a plurality of sequential memory accesses. Compression of data received responsive to a memory access, where each bit of the data corresponds to a unique column group would result in an inability to identify failure of a specific group of memory cells associated with a repair address.

Figure 3:
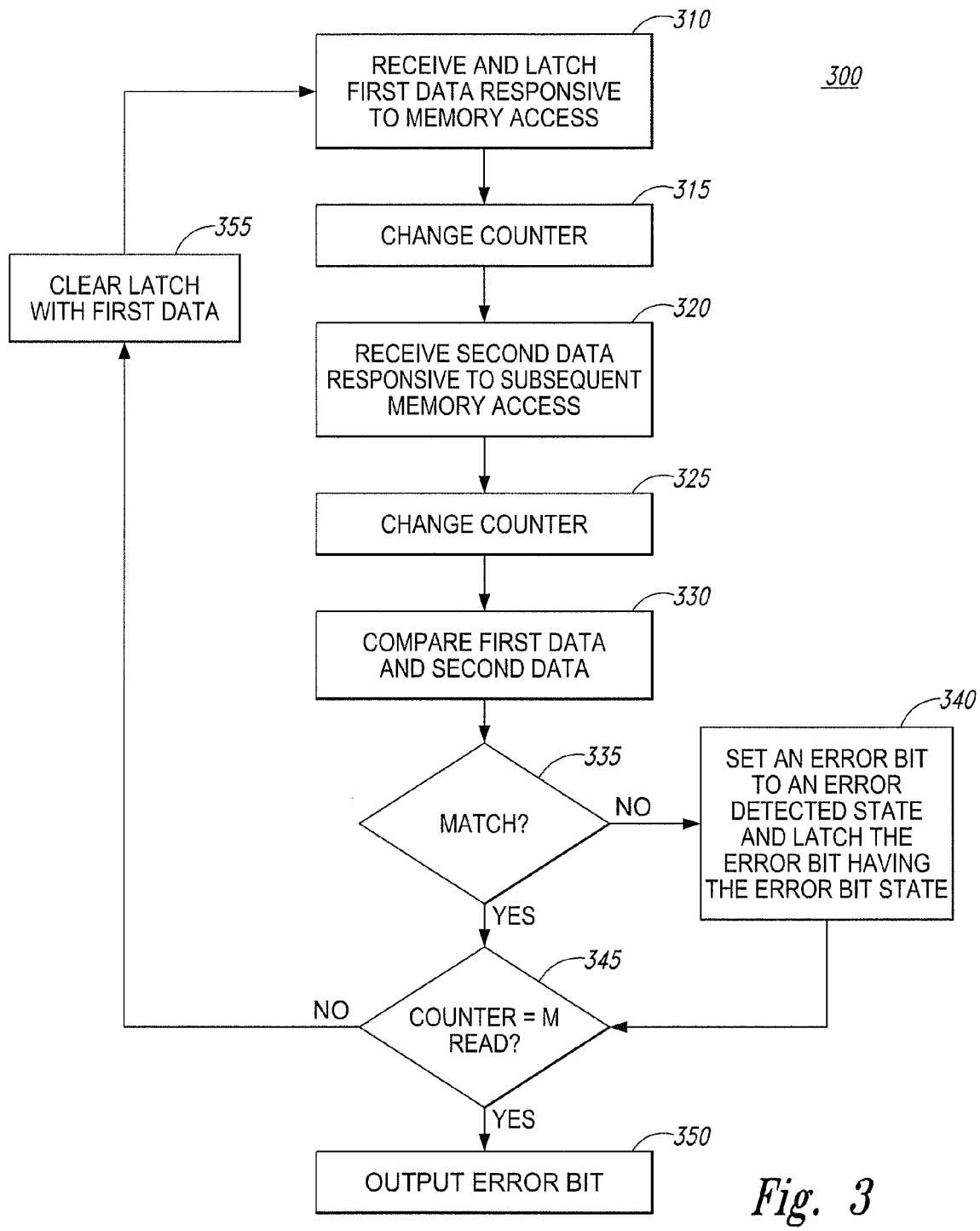
FIG. 3 is a flow chart of a particular illustrative embodiment of a method of compressing received responsive to a plurality of memory accesses.

Referring to FIG. 3, a flow chart of a particular illustrative embodiment of a method of compressing data received responsive to a plurality of memory accesses is designated 300. The method 300 may be performed by the apparatus 100 of FIG. 1 and/or the data compression circuit 200 of FIG. 2.

The method 300 may include receiving and latching first data responsive to a first memory access at a data compression circuit, at step 310. The data compression circuit may include the data compression block 120 of FIG. 1 and/or the data compression circuit 200 of FIG. 2. The method may further include changing (e.g., incrementing or decrementing) a counter, at step 315. The counter may include the counter 220 of FIG. 2. The counter may change responsive to a clock signal.

The method 300 may further include receiving second data responsive to a second memory access at the data compression circuit, at step 320. The method may further include changing the counter, at step 325. The method may further include comparing the first data and second data, at step 330. The comparison may be a bitwise comparison using XNOR logic.

The method 300 further includes determining whether the first data and the second data match based on the comparison, at step 335. In the method 300, if the first data does not match the second data, setting an error bit to an error detected state and latching the error bit having the error detected state, at step 340. If the first data matches the second data, the method 300 further includes maintaining a state of the error bit currently latched in the error bit latch. The method 300 further includes determining whether a value of the counter equal to M, at step 345. A value of M may be equal to a count of data to be compressed into an error bit.

If the value of the counter is not equal to M, the method 300 further includes resetting a latch storing the first data, at step 355, and repeating steps 310 to 345 to compare data responsive to subsequent memory accesses. If the value of the counter is equal to M, the method 300 further includes outputting a value of the error bit, at step 350. If the value of the counter is equal to M, the method 300 may further include resetting the error bit to a no error detected state at the error bit latch after outputting the error bit.

Figure 4:
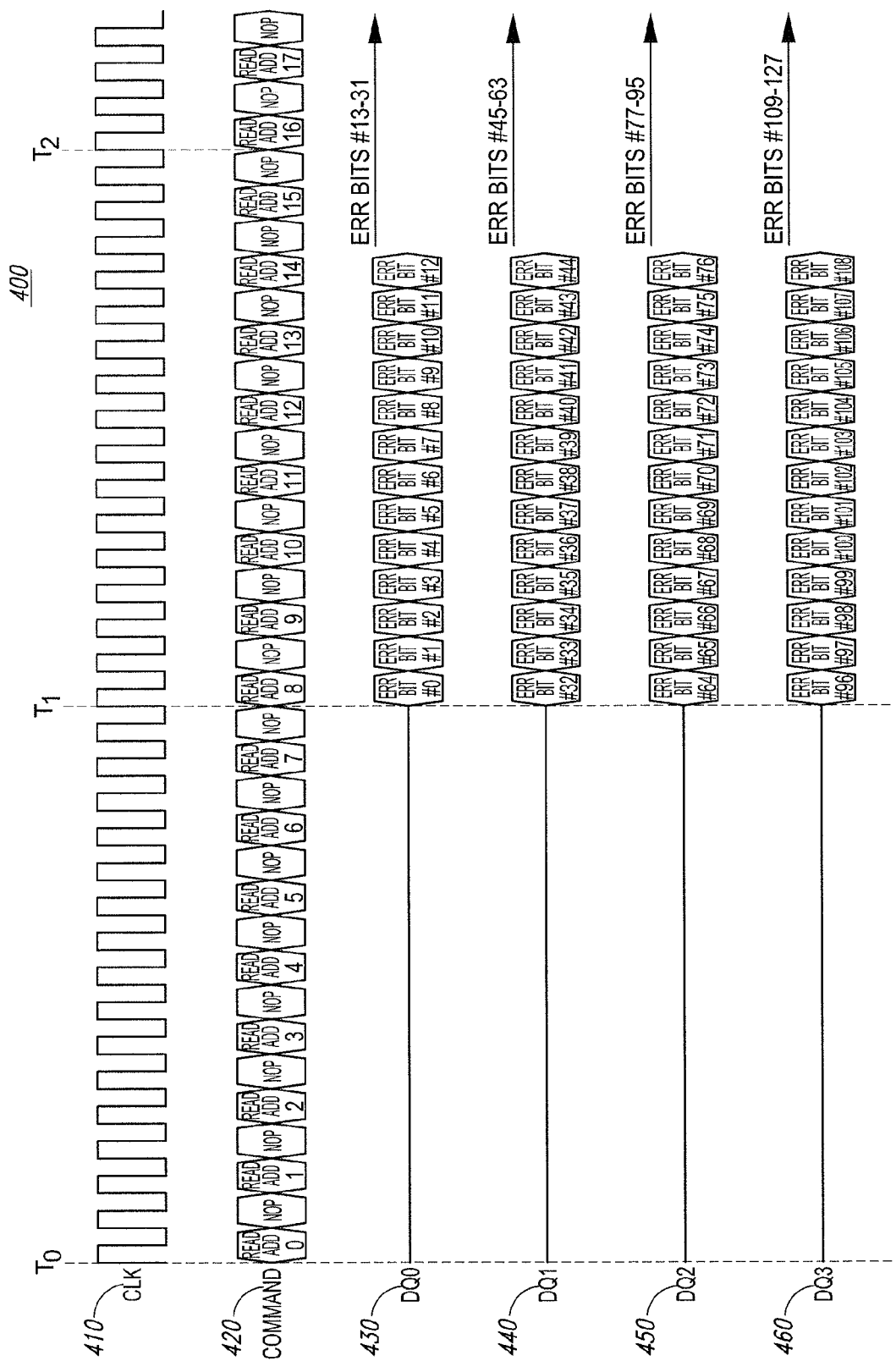
FIG. 4 is an exemplary timing diagram of a particular illustrative embodiment of a data compression responsive to a plurality of memory accesses.

Referring to FIG. 4, an exemplary timing diagram of a particular illustrative embodiment of a data compression responsive to a plurality of memory accesses is disclosed and generally designated 400. For example, the exemplary timing diagram 400 may illustrate timing characteristics of the apparatus 100 of FIG. 1, the compression circuit 200 of FIG. 2, and/or the method 300 of FIG. 3. The timing diagram 400 is exemplary in illustrating the specific, non-limiting example described with reference to FIGS. 1 and 2, where an array includes 128 I/O channels, and eight bits of data from each channel are compressed into an error bit. Accordingly, 128 column groups are contemporaneously evaluated in 128 compression circuits of a compression block, with each of the 128 column groups configured to provide data to a respective I/O channel. The timing diagram could be modified to, for example, account for a different number of I/O channels, a different count of data bits to compress, or an architecture requiring more or less than two clock cycles per read command. The timing diagram includes a clock signal CLK 410, a command signal COMMAND 420, and data input/outputs DQ0-DQ3 430, 440, 450, and 460.

A first compression test cycle beginning at time T0 and ending at time T1, may include issuing a plurality of memory access commands beginning with a first memory access at time T0. A memory access command is issued every two CLK signal 410 cycles (e.g., READ ADD 0-7), with a no-operation (NOP) command issued between each memory access. In an embodiment where eight data bits are provided for each repair address, each respective compression circuit may compare data received responsive to eight memory accesses. After eight memory access commands have been issued, the compression block will produce error data including 128 error bits to provide at an output, where each of the 128 error bits is associated with a different column group. In an example, each error bit of the 128 error bits may be generated by a respective compression circuit 200 of FIG. 2. The 128 error bits may be serially output from a single DQ, such as DQ0 430, or may be divided amongst two or more DQs (e.g., DQ0-DQ3), with a subset of the error bits serially output from a respective DQ. In the exemplary embodiment of the timing diagram 400, the error bits are split to be output from DQ0-DQ3 430, 440, 450, and 460. In the timing diagram 400 at time T1, Err bit 0 is output, which may be associated with a first column group. Subsequent error bits Err bit 1-31 provided by DQ0 430 may be serially output responsive to the CLK signal 410. Similarly, beginning at time T1, DQ1 may provide error bits Err bit 32-63, DQ2 may provide error bits Err bit 64-95, and DQ3 may provide error bits Err bit 96-127.

Additionally, at time T1, after each compression circuit has provided a respective error bit, each compression circuit may reset an error bit latch storing a respective error bit. A second compression test cycle may begin at time T1 with issuance of memory access command READ ADD 8, and may conclude after eight memory accesses, e.g., after READ ADD 15 at time T2. At an end of the second compression test cycle, Time T2, error data including error bits 128-255 may be output by the compression circuits, with each bit corresponding to a respective column group.

Figure 5:
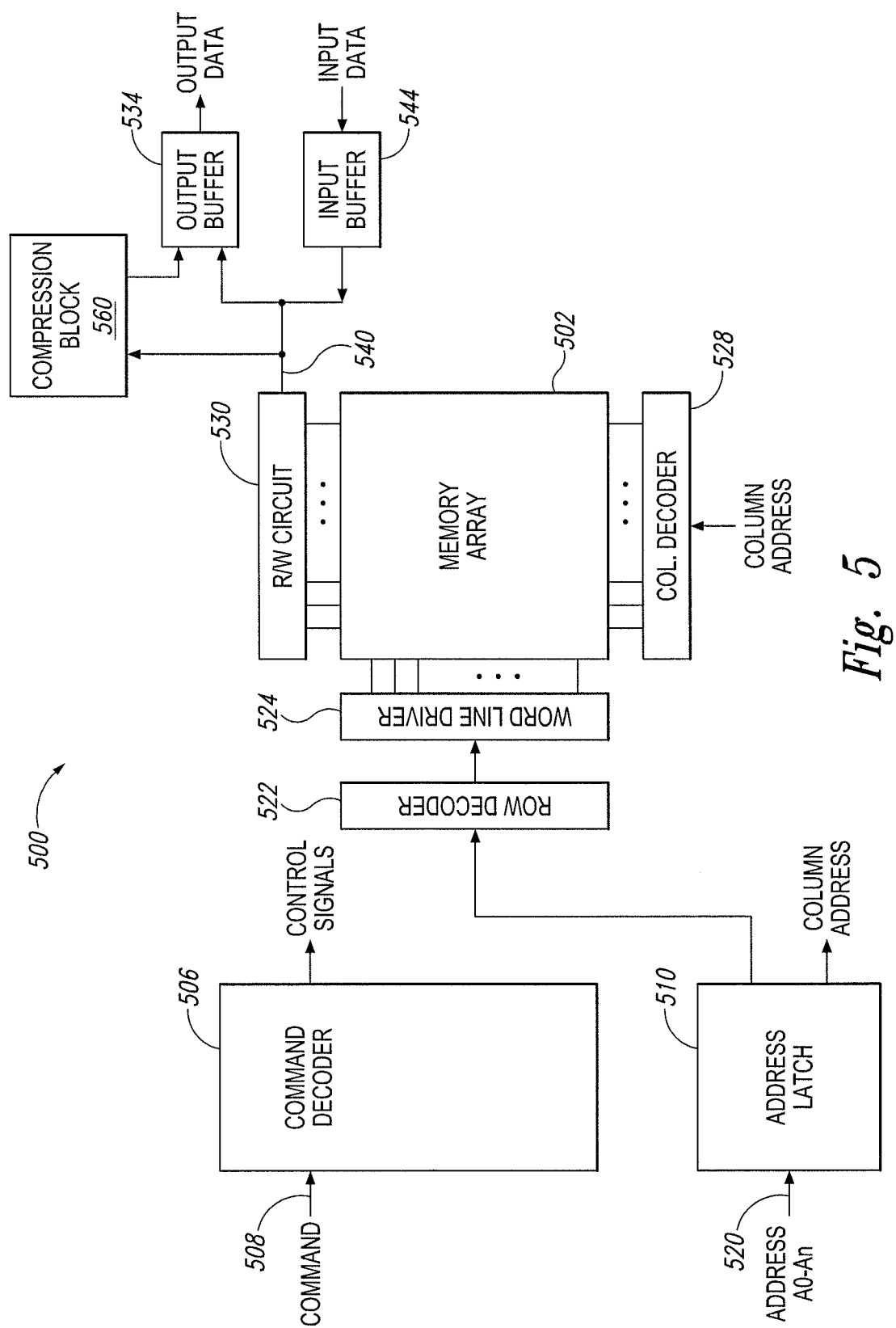
FIG. 5 is a block diagram of a memory including a data compression circuit according to an embodiment of the invention.

Referring to FIG. 5, a block diagram of a memory 500 including a compression block 560 according to an embodiment of the invention is disclosed. The memory 500 may include a memory array 502 of memory cells, which may be, for example, dynamic random-access memory (DRAM) memory cells, static random-access memory (SRAM) memory cells, flash memory cells, or some other types of memory cells. The memory 500 includes a command decoder 506 that may receive memory commands through a command bus 508 and generate corresponding control signals within the memory 500 to carry out various memory operations. Row and column address signals may be applied to an address latch 510 in the memory 500 through an address bus 520. The address latch 510 may then output a separate column address and a separate row address.

The address latch 510 may provide row and column addresses to a row address decoder 522 and a column address decoder 528, respectively. The column address decoder 528 may select bit lines extending through the memory array 502 corresponding to respective column addresses. The row address decoder 522 may be connected to a word line driver 524 that activates respective rows of memory cells in the memory array 502 corresponding to received row addresses. The selected data line (e.g., a bit line or bit lines) corresponding to a received column address may be coupled to a read/write circuitry 530 to provide read data to a data output buffer 534 via an input-output (I/O) data bus 540. Write data may be applied to the memory array 502 through a data input buffer 544 and the memory array read/write circuitry 530. The command decoder 506 may respond to memory commands applied to the command bus 508 to perform various operations on the memory array 502. In particular, the command decoder 506 may be used to generate internal control signals to read data from and write data to the memory array 502.

The compression block 560 may include the compression block 120 of FIG. 1 and/or the compression circuit 200 of FIG. 2, and may be capable of performing the method 300 of FIG. 3. For example, the compression block 560 may be configured to perform a data compression of data that is provided responsive to a plurality of memory accesses according to one of the embodiments described above or some other embodiment. The compression block 560 may be configured to compress data received responsive to the plurality of memory accesses into error data, and provide the error data at an output of the memory 500.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus, comprising:
   an array of memory cells, wherein the array is divided into a plurality of groups of memory cells, a group of memory cells of the plurality of groups of memory cells being associated with a respective channel of a plurality of channels, the respective channel of the plurality of channels configured to provide data from the group of memory cells of the plurality of groups of memory cells responsive to a memory access; and
   a compression block coupled to the array of the plurality of memory cells, the compression block comprising a plurality of compression circuits, a compression circuit of the plurality of compression circuits coupled to the respective channel of the plurality of channels, wherein the compression circuit of the plurality of compression circuits is configured to compare first data provided by the respective group of memory cells of the plurality of groups of memory cells responsive to a first memory access with second data provided by the respective group of memory cells of the plurality of groups of memory cells responsive to a second memory access and, responsive to the comparison of the first data with the second data indicating an error, to set an error bit to an error detected state and to latch the error bit having the error detected state.

2. The apparatus of claim 1, wherein a count of the plurality of memory accesses is equal to a count of bits of data to be compressed into the error bit.

3. The apparatus of claim 2, wherein the compression block is configured to change a counter responsive to a clock signal and to clear a respective error bit to a no error detected state responsive to a value of the counter being equal to the count of bits of data to be compressed into the error bit.

4. The apparatus of claim 1, wherein the group of memory cells of the plurality of groups of memory cells is associated with a respective repair address of a plurality of repair addresses.

5. The apparatus of claim 1, wherein the compression circuit of the plurality of compression circuits is configured to receive one or more respective bits of the data responsive to each memory access of the plurality of memory accesses.

6. The apparatus of claim 1, wherein the compression circuit of the plurality of compression circuits is configured to iteratively compare respective portions of the data, wherein each iterative comparison occurs responsive to receiving the respective portions of the data.

7. The compression circuit of claim 1, wherein the group of memory cells of the plurality of groups of memory cells corresponds to a column group of a plurality of column groups.

8. The compression circuit of claim 1, wherein the group of memory cells of the plurality of groups of memory cells corresponds to a row group of a plurality of row groups.

9. The compression circuit of claim 1, wherein the group of memory cells of the plurality of groups of memory cells corresponds to a subset of columns and a subset of rows.

10. The compression circuit of claim 1, further comprising an output buffer configured to receive a respective error bit from each of one or more of the plurality data compression circuits and to serially output each of the respective error bits while data is retrieved from an additional group of memory cells, where in the additional data is retrieved via an additional plurality of memory accesses.

11. The compression circuit of claim 1, wherein the group of memory cells is associated with a first channel of the plurality of channels and a second channel of the plurality of channels, wherein the first channel is configured to provide a first plurality of data from the group of memory cells, wherein each of the first plurality of data is provided responsive to a respective memory access command, and wherein the second channel is configured to provide a second plurality of data from the group of memory cells, wherein each of the first plurality of data and each of the second plurality of data provided responsive to a respective memory access of a plurality of memory accesses, wherein a compression circuit of the plurality of compression circuits is coupled to the first channel and to the second channel, wherein the compression circuit is configured to compare aggregated data including the first plurality of data and the second plurality of data aggregated together responsive to the plurality of memory accesses and, responsive to the comparison of the aggregated data indicating an error, to set an associated error bit to an error detected state and to latch the associated error bit having the error detected state.

12. A compression circuit, comprising:
   a comparator configured to compare first data provided by a group of memory cells associated with a repair address responsive to a first memory access with second data provided by the group of memory cells associated with the repair address responsive to a second memory access, wherein each the first data and the second data is sequentially provided by the group of memory cells responsive to a respective memory access of a plurality of the first memory access and the second memory access; and an error bit latch coupled to the comparison circuit, the error bit latch configured to, responsive to an output received from the comparison circuit indicating an error, setting an error bit to an error detected state and latching the error bit having the error detected state.

13. The compression circuit of claim 12, further comprising a data latch coupled to the comparator, the data latch configured to receive and latch one or more first bits of the data responsive to a first memory access of the plurality of memory accesses and to provide the first bit of the data to the comparator, wherein the comparator is further configured to receive one or more second bits of the data responsive to a second memory access of the plurality of memory accesses.

14. The compression circuit of claim 13, further comprising a counter configured to change responsive to a clock signal, the counter configured to clear the error bit of the error bit latch to a no error detected state responsive to the counter providing an active reset signal.

15. The compression circuit of claim 14, wherein the counter is configured to provide the active reset signal responsive to a value of the counter being equal to a count of bits in the data to be compressed into the error bit.

16. The compression circuit of claim 14, wherein the counter is further configured to clear the data latch responsive to the counter providing another active reset signal.

17. The compression circuit of claim 12, wherein the comparator is configured to perform a plurality of bitwise comparisons, wherein each of the plurality of bitwise comparisons includes a respective subset of bits of the data.

18. The compression circuit of claim 17, wherein the comparator comprises logic configured to detect a difference between the respective subset of bits of the data.

19. The compression circuit of claim 12, wherein each bit of the data is provided responsive to a respective memory access of the plurality of memory accesses.

20. A method, comprising:
receiving and latching first one or more bit of data from a group of memory cells associated with a repair address, the first one or more bits of the data provided responsive to a first memory access;
receiving second one or more bits of the data from the group of memory cells associated with the repair address, the second one or more bits of the data provided responsive to a second memory access;
comparing the first one or more bits of the data and the second one or more bits of the data; and
responsive to a comparison of the first one or more bits of the data and the second one or more bits of the data indicating an error, setting an error bit to an error detected state and latching the error bit having the error detected state.

21. The method of claim 20, further comprising comparing additional one or more bits of the data from the group of memory cells associated with the repair address, wherein each of the additional one or more bits of the data is provided responsive to a respective memory access of one or more memory accesses.

22. The method of claim 20, wherein comparing the first one or more bits of the data and the second one or more bits of the data comprises performing a bitwise comparison of the first bit and the second bit using logic capable of detecting a difference between any of the bits.

23. The method of claim 20, further comprising:
receiving and latching a next to last one or more bits of the data from the group of memory cells associated with the repair address responsive to a next to last memory access; and
receiving a last one or more bits of the data from the group of memory cells associated with the repair address responsive to a last memory access;
comparing the next to last one or more bits of the data and the last one or more bits of the data;
setting and latching the error bit to the error detected state based on a comparison of the next to last bit of the data and the last bit of the data indicating an error; and
providing the error bit at an output.

24. The method of claim 20, further comprising maintaining a state of the error bit currently latched in the error bit latch responsive to the comparison indicating that no error has been detected.

25. The method of claim 20, wherein the first memory access corresponds to a first clock cycle and the second memory access corresponds to a second clock cycle, the method further comprising:
changing a counter responsive the first clock cycle; and
changing the counter responsive the second clock cycle.

26. The method of claim 25, further comprising clearing a latch storing the first data responsive to a value of the counter.

27. The method of claim 26, wherein clearing the latch storing the first data based on the value of the counter comprises providing an active reset signal to the latch storing the first data based on the value of the counter indicating the second cycle has completed.

* * * * *

UNITED STATES PATENT AND TRADEMARK OFFICE
CERTIFICATE OF CORRECTION

PATENT NO. : 9,183,952 B2  
APPLICATION NO. : 13/771838  
DATED : November 10, 2015  
INVENTOR(S) : James S. Rehmeyer et al.

Page 1 of 1

It is certified that error appears in the above-identified patent and that said Letters Patent is hereby corrected as shown below:

In The Claims

| | Reads | Should Read |
|---|---|---|
| Column 11, Lines 4-5 | "access of a plurality of the first" | --access of the first-- |

Signed and Sealed this  
Fifth Day of April, 2016

Michelle K. Lee  
*Director of the United States Patent and Trademark Office*